United States Patent [19]
Cornils et al.

[11] Patent Number: 4,510,182
[45] Date of Patent: Apr. 9, 1985

[54] METHOD FOR THE PRODUCTION OF HOMOGENEOUS COATINGS OF TWO OR MORE METALS AND/OR METAL COMPOUNDS

[75] Inventors: Boy Cornils, Dinslaken; Bela Tihanyi; Jürgen Weber, both of Oberhausen; Werner DeWin, Dinslaken; Edwin Erben, Munich; August Mühlratzer, Giiching, all of Fed. Rep. of Germany

[73] Assignees: Ruhrchemie Aktiengesellschaft; Maschinenfabrik Augsburg-Nurnberg, both of Fed. Rep. of Germany

[21] Appl. No.: 604,085

[22] Filed: Apr. 26, 1984

Related U.S. Application Data

[63] Continuation-in-part of Ser. No. 410,796, Aug. 23, 1982, abandoned.

[30] Foreign Application Priority Data

Aug. 27, 1981 [DE] Fed. Rep. of Germany ....... 3133871

[51] Int. Cl.$^3$ ................................................ B05D 5/06
[52] U.S. Cl. ................................... 427/162; 427/165; 427/166; 427/226; 427/228; 427/229; 427/249; 427/252; 427/255; 427/255.2; 427/255.3
[58] Field of Search .............. 427/162, 166, 165, 163, 427/252, 249, 253, 255, 255.2, 226, 229, 228, 314, 319, 320, 383.1, 383.3, 433, 436, 443.2, 380

[56] References Cited

U.S. PATENT DOCUMENTS

| | | | |
|---|---|---|---|
| 2,812,272 | 11/1957 | Nack et al. | 427/252 |
| 2,898,234 | 8/1959 | Nack et al. | 427/252 |
| 3,018,194 | 1/1962 | Norman et al. | 427/252 |
| 3,071,493 | 1/1963 | Whaley et al. | 427/252 |
| 3,075,858 | 1/1963 | Breining et al. | 427/252 |
| 3,083,550 | 4/1963 | Averbach | 427/252 |
| 4,431,708 | 2/1984 | Carver et al. | 427/252 |

*Primary Examiner*—Sadie L. Childs
*Attorney, Agent, or Firm*—Jordan B. Bierman

[57] ABSTRACT

A method for the production of homogeneous coatings of a substance comprising at least two metals and/or metal compounds on a substrate, which method comprises depositing the substance from a gas or liquid phase from dinuclear or polynuclear mixed metal compounds via a four step process comprising heating the substance to 85-90% of a final temperature over a period of 5 to 20 minutes, reducing the temperature to a second temperature which is 2/3 of said final temperature, maintaining the second temperature for 1½ to 2½ hours, raising the second temperature over a period of 20 to 40 minutes, and maintaining the final temperature for 1 to 2 hours. The coated materials are, for example, useful for coating solar collectors with an $\alpha$ of at least 0.70 and an $\epsilon$ no greater than 0.30.

17 Claims, No Drawings

METHOD FOR THE PRODUCTION OF HOMOGENEOUS COATINGS OF TWO OR MORE METALS AND/OR METAL COMPOUNDS

This application is a continuation-in-part of Ser. No. 410,796, filed Aug. 23, 1982, now abandoned, which claims the benefit of the priority of German Application No. P 31 33 871.2, filed Aug. 27, 1981.

The present invention is directed to coatings and methods for the production thereof which are stable at high temperatures and which have a homogeneous distribution of metal components at the atomic or molecular level. In particular, such coatings which have a high solar absorption capacity and/or a low heat emission capacity are especially useful in solar collectors.

Thin layers of metals or their compounds used for solar collectors have been known for some time. These materials have good absorption and emission properties at low temperatures, and are normally deposited on the substrate by a thermal or reactive process. However, such coatings, whether on metallic or non-metallic inorganic substrates, tend to agglomerate at elevated temperatures. As a result, certain of their important physical properties are substantially altered and their usefulness as solar collectors is impaired. More specifically, the agglomeration is usually an irreversible accretive crystallization or recrystallization. In order to be able to retain the original properties, this agglomeration must be either prevented or, at minimum, suppressed. One means to achieve this objective is to incorporate foreign substances which either limit or slow down the accretion and recrystallization. The homogeneous distribution of the metal components is especially important in this connection.

It is extremely difficult to produce such layers, especially those which are sufficiently homogeneous. For example, multi-component layers in a fine distribution can be produced by specialized physical depositions such as coating, sputtering, or ion plating. However, these methods are carried out under a vacuum of $10^{-3}$ to $10^{-8}$ bar. Obviously, this requires highly sophisticated and expensive equipment which must be operated with extreme care. The substantial capital expense and high operating costs have prevented a wider application of these processes.

Layers of this type have also been produced by the application and subsequent decomposition of pastes or viscous solutions prepared by mixing the desired components. However, this method produces only coarse distribution of the components because of the low rate of diffusion coupled with the difficulty of mixing the viscous materials.

Simultaneous deposition of two or more metal components from a gas phase has also been attempted. However, this procedure has been substantially unsuccessful because of varying vapor pressures and decomposition temperatures of the volatile metal compounds.

Thus, the prior art methods for producing thin layers of two or more metal components have been unsatisfactory due to high costs of production and capital equipment, insufficient homogeneity of the layers, or both. It is, therefore, among the objects of the present invention to provide a method for the formation of thin layers of at least two metals or compounds thereof in a homogeneous and inexpensive manner.

In practicing the present invention, at least two metals and/or compounds thereof are deposited on a substrate from a gas or liquid phase by the use of dinuclear or polynuclear metal compounds. The coating is carried out according to methods which are currently known. However, in each method, a specific temperature regulation scheme is required to obtain the coatings of the invention.

Chemical vapor deposition (CVD) has been found successful. This method deposits solids such as metals, metal oxides, or carbides by thermal decomposition or chemical reaction between the volatile starting compound and one or more reactants from a gas phase onto a hot substrate. The reactions which take place in this process include reduction and hydrolysis. In addition, more complicated reactions may also take place; for example, in the deposition of TiC from $TiCl_4$, $CCl_4$, and $H_2$. The deposition of the solid constitutes a heterogeneous reaction on the surface of the substrate. The volatile reactants are generally transported by means of a carrier gas. In a preferred form of the invention, this comprises an inert gas such as nitrogen.

Another means for producing coatings according to the present invention is to pyrolyze the starting compound from a liquid phase. In this method, solutions or suspensions of thermally decomposable substances are applied to the surface of the substrate, dried, and then heated to temperatures above their decomposition temperature.

The temperature regulation of the thermal decomposition coating operation is carried out in four distinct phases. When decomposition begins, the temperature is raised to about 85-95%, preferably 90%, of the final temperature over a period of about 5 to about 20 minutes, preferably about 5 to about 10 minutes. Then the temperature is set at about 62-72%, preferably ⅔, of the final temperature for about 1½ to 2½ hours, preferably 2 hours. The third step is raising the temperature to the final temperature level over a period of about 20-40 minutes, preferably 30 minutes. Finally, the final temperature is maintained for about 1-2 hours, preferably 1½ hours.

The final temperature chosen is dependent upon the temperature at which decomposition begins. This point is found by decomposing the compounds in question in a porcelain container, preferably a porcelain boat, in the presence of air in a tubular furnace. Generally 350° C. is the final temperature for compounds which begin decomposition at or below 300° C. Citrates and carbonyls usually fall into this category. For substances which begin to decompose at temperatures in excess of 300° C. the final temperature is 50° C. above the temperature at which decomposition begins. Di-2-ethylhexanoate is in this group. In any event the substances are subjected to the above 4 step treatment. A choice of final temperatures different from that described above, where desired, will be apparent to the person of ordinary skill in the art.

Layers produced in accordance with the present invention are characterized by metal components which are homogeneously distributed throughout the layer at the atomic or molecular level. This insures that accretive crystallization or recrystallization does not occur. These layers have absorption values ($\alpha$) of at least 0.70 and emission values ($\epsilon$) of no more than 0.30. Absorption and emission are described in detail in German Industrial Standard DIN 5036 and the American Society for Testing and Materials Standard E 434.

The nature of the substrate used is of minor importance. A wide variety of such materials can be used effectively with the present invention. Among the suitable substrates are steels, nickel, cobalt, molybdenum, titanium, silver, gold, and platinum. Inorganic materials such as metal oxides, graphite, glass, as well as organic substrates such as thermally stable plastics may also be used. The selection of the particular substrate is dependent upon its known characteristics and the intended use for the coated material.

The process of the present invention is of particular importance in the production of solar coatings. It has been found that both absorber and reflector layers can be manufactured by this means.

The term dinuclear or polynuclear metal compounds refers to compounds containing at least two different metal atoms in a single molecule. Such compounds are derived from the transition elements, the lanthanides, beryllium, magnesium, aluminum, gallium, indium, thallium, germanium, tin, and lead. The transition elements referred to are those which fall within the definition given in Cotton/Wilkinson, "Inorganic Chemistry", 1967, p. 584.

It is an important advantage of the present invention that the method can be applied to all the foregoing metals. Compounds which are particularly desirable include such metals as iron, cobalt, nickel, molybdenum, chromium, tungsten, rhodium, ruthenium, platinum, palladium, manganese, magnesium, aluminum, and rhenium.

It is also contemplated that the polynuclear compounds of the present invention, as well as the coatings prepared therefrom, may also contain "semi-metals" or non-metals such as boron, silicon, phosphorus, carbon, oxygen, sulphur, selenium, tellurium, and antimony, both in pure or combined forms.

Also useful as polynuclear metal compounds are carbonyls, carboxylates, alcoholates, and oxide carboxylates. Compounds which have been found particularly suitable for use in the present invention are as follows:

| | |
|---|---|
| $FeCo_3H(CO)_{12}$ | Bis[$\mu$-tricarbonylcobalt](tricarbonyl iron)(tricarbohydridocobalt) (3 Co—Co; 2 Fe—Co) |
| $(CO)_2C_5H_5FeMoC_5H_5(CO)_3$ | Dicarbonyl-$\eta$-cyclopentadienyl (tricarbonyl-$\eta$-cyclopentadienylmolybdo)iron |
| $(CO)_2C_5H_5FeMn(CO)_5$ | Dicarbonyl-$\eta$-cyclopentadienyl (pentacarbonylmangano)iron |
| $FeCo_2(CO)_9S$ | Cyclo-(tricarbonylferro)-bis(tricarbonylcobalt)(2 Co—Fe; Co—Co)-sulphide |
| $(CO)_5MnCo(CO)_4$ | Pentacarbonyl(Tetracarbonylcobalto)manganese |
| $(CO)_5ReCo(CO)_4$ | Pentacarbonyl(tetracarbonylcobalto)rhenium |
| $(CO)_3C_5H_5MoMn(CO)_5$ | Tricarbonyl-$\eta$-cyclopentadienyl (pentacarbonylmangano)molybdenum |
| $(CO)_3C_5H_5WMn(CO)_5$ | Tricarbonyl-$\eta$-cyclopentadienyl-(pentacarbonylmangano)tungsten |
| $(CO)_3C_5H_5MoWC_5H_5(CO)_3$ | Tricarbonyl-$\eta$-cyclopentadienyl-(tricarbonyl-$\eta$-cyclopentadienyl-tungsto)molybdenum |
| $TlCo(CO)_4$ | Thallium-tetracarbonylcobaltate |
| $InCo_3(CO)_{12}$ | Indium-dodecacarbonyltricobaltate |
| $PH_3PAuCo(CO)_4$ | Tetracarbonyl[(triphenylphosphan)auro]cobalt |
| $(CO)_2C_5H_5FeHgCo(CO)_4$ | Mercury (dicarbonyl-$\eta$-cyclopentadienylferro)(tetracarbonylcobalt) |
| $Me_2Sn[Co(CO)_3PPh_3]_2$ | Dimethyltin-bis[tricarbonyl(triphenylphosphan)cobaltate] |
| $Ph_3GeFeC_5H_5(CO)_2$ | Dicarbonyl-$\eta$-cyclopentadienyl(triphenylgermanium)-iron |
| $PbFe(CO)_4$ | Lead-tetracarbonylferrate |
| $Bi_2Fe_5(CO)_{20}$ | Dibismuth-didecacarbonylpentaferrate |
| $SbFe(CO)_4$ | Antimony-tetracarbonylferrate |
| $Ph_3GeMn(CO)_5$ | Pentacarbonyl(triphenylgermanium)manganese |
| $Ph_3SnCrC_5H_5(CO)_3$ | Tricarbonyl-$\eta$-cyclopentadienyl(triphenylstannan) chromium |
| $Ph_3SnWC_5H_5(CO)_3$ | Tricarbonyl-$\eta$-cyclopentadienyl(triphenylstannan)-tungsten |
| $(CO)_3C_5H_5MoSnMe_2Mn(CO)_5$ | Dimethylstannin(pentacarbonylmanganese) tricarbonyl-$\eta$-cyclopentadienylmolybdenum |
| $[Co(CH_3COCH_3)_6][FeCo_3(CO)_{12}]_2$ | Hexaacetonecobalt-bis(dodecacarbonyl)iron tricobaltate |

Cobalt nickel citrate.
Molybdic acid-cobalt citrate
Manganese-cobalt oxide-2-ethylhexanoate
Chromium-nickel oxide-2-ethylhexanoate
Nickel-aluminum isopropylate
Manganese-aluminum isopropylate
Chromium-aluminum isopropylate The ratio of metals in the final coating is determined by the composition of the polynuclear compounds. Where two different metals, A and B, are used, corresponding to the accessibility of the metal compounds used according to the invention, the ratio of A:B is from about 2:1 to 1:2. However, atomic ratios outside this range are also possible. Such ratios are rare because of the general lack of polynuclear compounds having such compositions. The preparation of polynuclear compounds is known to the person of ordinary skill and need not be repeated in detail here.

The composition and properties, as well as the adhesion of the layers, depends on whether the process is carried out in a reducing, oxidizing, or inert atmosphere. Other parameters which affect the nature of the ultimate layer are the substrate temperature, vapor pressure, the nature of the phase from which deposition takes place, and the deposition rate.

The coatings produced according to the present invention are outstandingly suitable as either reflectors or absorbers in an absorber-reflector tandem for solar collectors. Moreover, such layers are useful to produce magnets and for decorative purposes. Depending upon the coating parameters, shiny or matte surfaces can be produced. In some cases, highly absorbent layers can also be obtained.

It has been found that deposition from a gas phase using argon as the inert atmosphere results in shiny metallic layers. If an inert gas such as argon or nitrogen is combined with oxygen, then the coatings obtained are primarily oxides. If the deposition is carried out in a carbon monoxide stream, or in a mixture of carbon monoxide and inert gas, the coatings consist primarily of carbides. If the gas phase is carbon monoxide, the layers are primarily oxides or carbides.

The temperature used, as well as the velocity of the carrier gas, influence the formation of the layer structure. More specifically, they affect nucleation and nuclear growth.

It is contemplated that the layers produced in accordance with the present invention may also be subjected to reactive or thermal-reactive post-treatment in order to retain the properties needed for their intended use. Such post-treatment includes oxidation and reduction processes. Oxidation will produce a surface oxide layer which will protect the primary layer against further oxidation. Reduction is useful if, for example, pure metallic or oxide/metallic layers are desired.

The present method is useful in all cases in which a homogeneous distribution of metals or metal compounds is required. Surface micro analysis of layers produced in accordance with this invention indicates a uniform distribution of the metal components over the surface. This even distribution is retained even after exposing the layers to elevated temperatures. The magnetic properties of the layers are also better than those of coatings produced in accordance with the prior art.

The following examples are intended to illustrate the present invention and compare it with certain conventional processes.

EXAMPLE 1

To prepare an Fe-Co carbonyl, 95 ml of acetone is added to 29.63 g of dicobalt octacarbonyl and 10.34 g of iron pentacarbonyl in an inert gas atmosphere at 60° C. Monitoring of the exiting carbon monoxide enables determination of the degree of conversion. When the reaction is complete, a reddish-brown liquid is present, which is freed from excess acetone and iron pentacarbonyl by vacuum distillation. 39.2 g of hexaacetone cobalt-bis-dodecylcarbonyl iron-cobaltate with a cobalt content of 29.8% and an iron content of 5.1% remain in the form of black crystals.

The workpiece to be coated is a small V2A steel plate, previously treated with acetone to remove traces of grease. Coating takes place in a cylindrical glass apparatus heated in zones by an electric furnace, and through which a stream of nitrogen charged with hexaacetone cobalt-bis-dodecylcarbonyl iron-cobaltate is led. The inlet tube is insulated as far as the decomposition section of the apparatus in order to prevent any premature deposition of the metals. The coating of the workpiece takes place at 280° C., the gas stream flow rate being 3.8 cm/sec. A microscopically homogeneous metallic surface is produced having a microanalytically detectable uniform distribution of cobalt and iron in a ratio of Co/Fe=5.85.

EXAMPLE 2

A carbonyl containing molybdenum and manganese is prepared from equimolar amounts of cyclopentadienyl molybdenum tricarbonyl sodium and manganese pentacarbonyl chlorine in the presence of tetrahydrofuran. The residue remaining after distillation of the solvent and sublimation of the excess molybdenum hexacarbonyl is washed with n-hexane. Cyclopentadienyl molybdenum tricarbonyl manganese pentacarbonyl remains in the form of red crystals, with a molybdenum content of 21.75% and a manganese content of 12.42%.

Coating with cyclopentadienyl molybdenum tricarbonyl manganese pentacarbonyl is carried out at 310° C. and at a gas flow rate of 3.6 cm/sec. in an apparatus of the same type as in Example 1. The surface is seen to be homogeneous under 600×magnification. A microanalytical investigation of the surface at five different points shows a uniform ratio of the metals, with Mo/Mn=1.74.

EXAMPLE 3

In order to prepare a Co-Ni-mixed carboxylate of cobalt, 211.2 g of citric acid is dissolved at about 80° C. in 900 ml of water and is partially reacted at a temperature of 100° C. with 78.8 g of cobalt (II)-hydroxide carbonate which is slowly added. After 20 minutes' reaction time, 96.7 g of nickel (II)-hydroxide carbonate is added to the reaction mixture. After the nickel compound is dissolved, the resultant solution is subjected to fractional crystallization. The 185.8 g of crystals found in the main fraction at about 20° C. contained 14.7% by weight cobalt and 16.7% by weight nickel.

The workpiece to be coated is first cleaned with benzene. A composition of cobalt-nickel citrate in a mixture of linseed oil, 2-ethylhexanoic acid and n-butanol is applied to the surface of the workpiece and, after drying in air at 65° C., is decomposed in an airstream with a flow rate of 1.4 cm/sec as follows. First, heating takes place over 5 minutes to 315° C. (90% of the final temperature of 350° C.). It is then lowered to 235° C. (⅔ of the final temperature) for 2 hours. Finally, the temperature is raised to 350° C. (the final temperature) over 30 minutes and held there for 1½ hours. The surface is homogeneous and under microanalytical investigation shows a uniform metal ratio of Ni/Co=1.07 at various sites.

The sample was then tempered by heating for 4 hours at 500° C. The air stream flow rate was 1.4 cm/sec. Emission ($\epsilon$) and absorption ($\alpha$) values were obtained before and after tempering as follows:

| As deposited | After tempering (4 hours at 500° C.) |
| --- | --- |
| $\alpha = 0.72$ | $\alpha = 0.73$ |
| $\epsilon = 0.18$ | $\epsilon = 0.28$ |

Absorption is measured with a Zeiss PMQ 3 spectrophotometer between wavelengths of 0.36 um and 2.50 um. 100° C. hemispherical emittance is determined with a McDonald emission meter.

EXAMPLE 4

(Comparison Example)

Example 3 is repeated except that, instead of the Co-Ni mixed carboxylate, a mixture of cobalt citrate and nickel citrate in a preparation of linseed oil, 2-ethylhexanoic acid and n-butanol is applied to the surface of the workpiece. The apparently relatively uniform coating is found under the microscope at 2000× magnification to be non-homogeneous with widely varying Ni/Co ratios of between 0.04 and approximately 8.5 at various points on the workpiece. Absorption and emission values are determined as in Example 3 and are shown below.

| As deposited | After tempering (4 hours at 500° C.) |
| --- | --- |
| $\alpha = 0.54$ | $\alpha = 0.54$ |
| $\epsilon = 0.17$ | $\epsilon = 0.34$ |

EXAMPLE 5

(Comparative Example)

By analogy with Example 3, an approximately 4% solution of equimolar amounts of cobalt-2-ethylhexanoate and nickel-2-ethylhexanoate in a methanol/butanol/ethyl acetate mixture is applied by atomization to the workpiece and, after drying, respraying and renewed drying at about 65° C., is heated for 2 hours at 500° C. in an air atmosphere to decompose the above compounds. The resulting coating is markedly non-homogeneous, spotted, and exhibits varying metal ratios of between 0.28 and 4.3 at various points on the workpiece. Absorption and emission values are determined as in Example 3 and appear below.

| As deposited | After tempering (4 hours at 500° C.) |
| --- | --- |
| $\alpha = 0.58$ | $\alpha = 0.59$ |
| $\epsilon = 0.32$ | $\epsilon = 0.39$ |

EXAMPLE 6

To prepare a Co-Mn mixed metal carboxylate, 99.4 g of cobalt (II)-acetate-4-hydrate is dissolved with 98.2 g of manganese (II)-acetate-4-hydrate in 300 ml of water. On adding 115 g of 2-ethylhexanoic acid, some of the acetic acid is exchanged and is removed by distillation in the presence of 450 g of decalin. At the end of this reaction, the acetoxy group still present is substituted at about 190° C. by means of steam, with the formation of the metal hydroxide 2-ethylhexanoate. The coupling is effected by further thermal treatment with simultaneous release of water. 172 g of a bivalent manganese-cobalt oxide-2-ethylhexanoate of the type R—COOMn—O—Co—OOCR is formed, containing 13.6% by weight cobalt and 12.7% by weight manganese.

A previously cleaned workpiece is coated by the method described in Example 3 with manganese-cobalt-oxide-2-ethylhexanoate in a mixture of linseed oil, 2-ethylhexanoic acid and butanol, and heated after drying in an air atmosphere in the same manner of Example 3, except that the temperatures are based on a final temperature of 500° C. The brownish surface is homogeneous and shows a constant Mn/Co ratio at five different points. Absorption and emission values are determined as in Example 3 and are shown below.

| As deposited | After tempering (4 hours at 500° C.) |
| --- | --- |
| $\alpha = 0.75$ | $\alpha = 0.74$ |
| $\epsilon = 0.19$ | $\epsilon = 0.30$ |

EXAMPLE 7

(Comparison Example)

Example 2 is repeated except that, instead of a cyclopentadienyl molybdenum tricarbonyl manganese pentacarbonyl, an equimolar mixture of molybdenum dioxo-di-2-ethylhexanoate containing 19.8% molybdenum and manganese (II)-2-ethylhexanoate containing 14.2% manganese in a methanol/butanol/ethyl acetate mixture is sprayed by atomization onto the workpiece at a molar ratio of 1:1. After drying, respraying and renewed drying at about 65° C., the mixture is heated to 500° C. for two hours in an air atmosphere to decompose the above compounds. The resulting coating is markedly non-homogeneous and exhibits varying metal ratios of manganese to molybdenum of between 0.08 and 2.93 at different points.

| As deposited | After tempering (4 hours at 500° C.) |
| --- | --- |
| $\alpha = 0.62$ | $\alpha = 0.65$ |
| $\epsilon = 0.27$ | $\epsilon = 0.49$ |

These absorption and emission values are determined as in Example 3.

EXAMPLE 8

Example 3 is repeated except that the testpiece is heated in a preheated muffle furnace for a period of 2 minutes instead of 5 minutes. Parts of the coating crack. Therefore, this coating is useless.

EXAMPLE 9

Example 3 is repeated except that instead of initial heating for 5 minutes, the test piece is heated initially for 120 minutes. While the resultant coatings adhere to the metal testpiece and have a constant metal ratio of 1.06, the optical data are unacceptably poor immediately after deposition. The emission and absorption values are determined as in Example 3 and appear below.

| As deposited |
| --- |
| $\alpha = 0.65$ |
| $\epsilon = 0.54$ |

Although only a limited number of specific embodiments have been expressly described, the invention is, nonetheless, to be broadly construed, and not to be limited except by the character of the claims appended hereto.

What we claim is:

1. A method for the production of homogeneous coatings of a substance comprising at least two components selected from metals and metal compounds on a substrate comprising depositing said substance from a liquid phase from dinuclear or polynuclear mixed metal compounds by heating said dinuclear or polynuclear compounds to a first temperature about 85–90% of a final temperature over a period of about 5 to about 20 minutes, then heating at a second temperature about 62 to about 72% of said final temperature for about 1½ to about 2½ hours, then raising the temperature to the final temperature over about 20 to about 40 minutes and maintaining the final temperature for about 1 to about 2 hours, whereby said coating exhibits optical properties of at least 0.70 absorption and no greater than 0.30 emission.

2. The method of claim 1 wherein said first temperature is about 90% of said final temperature.

3. The method of claim 1 wherein said heating to said first temperature is over a period of about 5 to about 10 minutes.

4. The method of claim 1 wherein said second temperature is about ⅔ of said final temperature.

5. The method of claim 1 wherein said heating at said second temperature is for about 2 hours.

6. The method of claim 1 wherein said second temperature is raised to said final temperature over about 30 minutes.

7. The method of claim 1 wherein said final temperature is maintained for about 1½ hours.

8. The method of claim 1 wherein said compounds are selected from carbonyls, carboxylates, alcoholates, and oxide carboxylates.

9. The method of claim 1 wherein said metals are selected from transition elements, lanthanides, beryllium, magnesium, aluminum, gallium, indium, thallium, germanium, tin, and lead.

10. The method of claim 1 wherein said substance is selected from

| | |
|---|---|
| FeCo$_3$H(CO)$_{12}$ | Bis[μ-tricarbonylcobalt](tricarbonyl iron)(tricarbohydridocobalt) (3 Co—Co; 2 Fe—Co) |
| (CO)$_2$C$_5$H$_5$FeMoC$_5$H$_5$(CO)$_3$ | Dicarbonyl-η-cyclopentadienyl (tricarbonyl-η-cyclopentadienylmolybdo)iron. |
| (CO)$_2$C$_5$H$_5$FeMn(CO)$_5$ | Dicarbonyl-η-cyclopentadienyl (pentacarbonylmangano)iron |
| FeCo$_2$(CO)$_9$S | Cyclo-(tricarbonylferro)-bis (tricarbonylcobalt)(2 Co—Fe; Co—Co)-sulphide |
| (CO)$_5$MnCo(CO)$_4$ | Pentacarbonyl(Tetracarbonylcobalto)manganese |
| (CO)$_5$ReCo(CO)$_4$ | Pentacarbonyl(tetracarbonylcobalto)rhenium |
| (CO)$_3$C$_5$H$_5$MoMn(CO)$_5$ | Tricarbonyl-η-cyclopentadienyl(pentacarbonylmangano)molybdenum |
| (CO)$_3$C$_5$H$_5$WMn(CO)$_5$ | Tricarbonyl-η-cyclopentadienyl(pentacarbonylmangano)tungsten |
| (CO)$_3$C$_5$H$_5$MoWC$_5$H$_5$(CO)$_3$ | Tricarbonyl-η-cyclopentadienyl(tricarbonyl-η-cyclopentadienyltungsto)molybdenum |
| TlCo(CO)$_4$ | Thallium-tetracarbonylcobaltate |
| InCo$_3$(CO)$_{12}$ | Indium-dodecacarbonyltricobaltate |
| Ph$_3$PAuCo(CO)$_4$ | Tetracarbonyl[(triphenylphosphan)auro]cobalt |
| (CO)$_2$C$_5$H$_5$FeHgCo(CO)$_4$ | Mercury (dicarbonyl-η-cyclopentadienylferro)(tetracarbonylcobalt) |
| Me$_2$Sn[Co(CO)$_3$PPh$_3$]$_2$ | Dimethyltin-bis[tricarbonyl (triphenylphosphan)cobaltate] |
| Ph$_3$GeFeC$_5$H$_5$(CO)$_2$ | Dicarbonyl-η-cyclopentadienyl(triphenylgermanium)-iron |
| PbFe(CO)$_4$ | Lead-tetracarbonylferrate |
| Bi$_2$Fe$_5$(CO)$_{20}$ | Dibismuth-didecacarbonylpentaferrate |
| SbFe(CO)$_4$ | Antimony-tetracarbonylferrate |
| Ph$_3$GeMn(CO)$_5$ | Pentacarbonyl(triphenylgermanium)manganese |
| Ph$_3$SnCrC$_5$H$_5$(CO)$_3$ | Tricarbonyl-η-cyclopentadienyl(triphenylstannan)chromium |
| Ph$_3$SnWC$_5$H$_5$(CO)$_3$ | Tricarbonyl-η-cyclopentadienyl(tri-phenylstannan)-tungsten |
| (CO)$_3$C$_5$H$_5$MoSnMe$_2$Mn(CO)$_5$ | Dimethylstannin(pentacarbonylmanganese) tricarbonyl-η-cyclopentadienylmolybdenum |
| [Co(CH$_3$COCH$_3$)$_6$][FeCo$_3$(CO)$_{12}$]$_2$ | Hexaacetonecobalt-bis(dodecacarbonyl)iron tricobaltate |

Cobalt nickel citrate
Molybdic acid-cobalt citrate
Manganese-cobalt oxide-2-ethylhexanoaten
Chromium-nickel oxide-3-ethylhexanoate
Nickel-aluminum isopropylate
Manganese-aluminum isopropylate
Chromium-aluminum isopropylate.

11. The method of claim 1 wherein said coating is deposited by pyrolysis of said compound dissolved or suspended in a liquid.

12. The method of claim 1 wherein the ratio of one of said metals to the other is from about 2:1 to 1:2.

13. The method of claim 1 wherein depositing takes place in a reducing, oxidizing, or inert atmosphere.

14. The method of claim 13 wherein said atmosphere is an oxidizing atmosphere.

15. The method of claim 14 wherein said atmosphere comprises oxygen.

16. The method of claim 1 wherein said final temperature is 350° C. for compounds which begin decomposition at and below 300° C.

17. The method of claim 1 wherein said final temperature is 50° C. above the temperature at which decomposition begins for compounds which begin decomposition above 300° C.

* * * * *